(12) United States Patent
Zhang et al.

(10) Patent No.: US 11,647,599 B2
(45) Date of Patent: May 9, 2023

(54) FLEXIBLE DISPLAY MODULE MIDDLE FRAME AND DISPLAY DEVICE

(71) Applicant: BOE TECHNOLOGY GROUP CO., LTD., Beijing (CN)

(72) Inventors: Shouchuan Zhang, Beijing (CN); Shangchieh Chu, Beijing (CN); Yonghong Zhou, Beijing (CN); Baofeng Sun, Beijing (CN); Yanyan Yang, Beijing (CN); Pengfei Zhou, Beijing (CN); Meiling Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 17/333,097

(22) Filed: May 28, 2021

(65) Prior Publication Data

US 2022/0071035 A1 Mar. 3, 2022

(30) Foreign Application Priority Data

Sep. 2, 2020 (CN) .......................... 202010908843.7

(51) Int. Cl.
*H05K 5/00* (2006.01)
*H05K 5/02* (2006.01)
*F16H 1/14* (2006.01)
*F16H 25/20* (2006.01)

(52) U.S. Cl.
CPC ......... *H05K 5/0226* (2013.01); *H05K 5/0017* (2013.01); *F16H 1/14* (2013.01); *F16H 25/20* (2013.01); *F16H 2025/2093* (2013.01)

(58) Field of Classification Search
None
See application file for complete search history.

(56) References Cited

U.S. PATENT DOCUMENTS

| | | | | |
|---|---|---|---|---|
| 10,057,998 | B1 * | 8/2018 | Jiang | H05K 5/0017 |
| 10,082,838 | B1 * | 9/2018 | Hong | E05D 11/0081 |
| 10,254,803 | B1 * | 4/2019 | Quinn | G06F 1/1688 |
| 11,185,765 | B2 * | 11/2021 | Tseng | G06F 1/1671 |
| 11,191,195 | B2 * | 11/2021 | Baek | H05K 5/0217 |
| 11,283,910 | B2 * | 3/2022 | Lee | H04M 1/0268 |
| 11,392,181 | B2 * | 7/2022 | Yoo | H01Q 13/10 |
| 2010/0124008 | A1 * | 5/2010 | Chang | G06F 1/1616 |
| | | | | 361/679.26 |
| 2018/0324964 | A1 * | 11/2018 | Yoo | H05K 1/189 |
| 2021/0064084 | A1 * | 3/2021 | Lin | G06F 1/1681 |
| 2021/0200279 | A1 * | 7/2021 | Lin | G06F 1/1616 |

* cited by examiner

*Primary Examiner* — Anthony Q Edwards
*Assistant Examiner* — Rashen E Morrison
(74) *Attorney, Agent, or Firm* — Brooks Kushman P.C.

(57) ABSTRACT

A flexible display module middle frame is provided. The flexible display module middle frame includes: a first frame, configured to connect with a first non-bending area of a flexible display module; a second frame, configured to connect with a second non-bending area of the flexible display module; a bending structure connected to the first frame and the second frame and configured to control the first frame and the second frame to rotate relative to each other; and a first sliding connection frame connected to a side of the first frame away from the second frame, a second sliding connection frame connected to a side of the second frame away from the first frame.

20 Claims, 5 Drawing Sheets light-emitting surface

FLEXIBLE DISPLAY MODULE MIDDLE FRAME AND DISPLAY DEVICE

CROSS REFERENCE OF RELATED APPLICATION

This application claims priority to Chinese Patent Application No. 202010908843.7 filed on Sep. 2, 2020, which is incorporated herein by reference in its entirety.

TECHNICAL FIELD

The present disclosure relates to a display product manufacturing technical field, in particular to a flexible display module middle frame and a display device.

BACKGROUND

With the development of mobile terminal display devices, large screens are increasingly popular with people. However, as the size of the display screen increases, the size of the display device also increases and the portability also decreases accordingly. In order to solve the above problems, flexible displays have come to be produced, and the size of the display device is reduced by bending. However, the flexible screen can generate a certain amount of slippage when being bent, but the size of the middle frame for bearing and fixing the flexible screen is fixed and unchanged, so that a frame with a certain width needs to be arranged, and the frameless setting cannot be realized.

SUMMARY

A flexible display module middle frame is provided in the present disclosure, including:

a first frame, configured to connect with a first non-bending area of a flexible display module;

a second frame, configured to connect with a second non-bending area of the flexible display module;

a bending structure connected to the first frame and the second frame and configured to control the first frame and the second frame to rotate relative to each other, to enable the flexible display module middle frame to be in a first state, a second state and a third state; where in the first state, the first frame and the second frame rotate oppositely along a first rotating direction to enable the flexible display module to be in an inward-folded state, and a light-emitting surface of the flexible display module corresponding to the first non-bending area faces a light-emitting surface of the flexible display module corresponding to the second non-bending area; in the second state, the first frame and the second frame rotate oppositely along a second rotation direction, to enable flexible display module to be in an outward-folded state, and a back surface of the first non-bending area faces a back surface of the second non-bending area; in the third state, the first frame and the second frame are in a same plane, to enable the flexible display module to be in an unfolded state, and the light-emitting surface of the flexible display module corresponding to the first non-bending area and the light-emitting surface of the flexible display module corresponding to the second non-bending area are in a same plane; and a first sliding connection frame connected to a side of the first frame away from the second frame, a second sliding connection frame connected to a side of the second frame away from the first frame;

in the first state, the first sliding connection frame is configured to move away from first frame, the second sliding connection frame is configured to move away from the second frame;

in the second state, the first sliding connection frame is configured to move close to the first frame, the second sliding connection frame is configured to move close to the second frame;

in the third state, the first sliding connection frame is spaced apart from the first frame at a first preset distance, the second sliding connection frame is spaced apart from the second frame at a second preset distance.

Optionally, the bending structure includes a support frame between the first frame and the second frame, the support frame is rotatably connected to the first frame through at least one transmission component, and the support frame is rotatably connected to the second frame through at least one transmission component;

the bending structure further includes at least one sliding transmission component in a transmission connection with the transmission component connected to the first frame to drive the first sliding connection frame to move away from or close to the first frame;

the bending structure further includes at least one sliding transmission component in a transmission connection with the transmission component connected to the second frame to drive the second sliding connection frame to move away from or close to the second frame.

Optionally, the support frame is rotatably connected to the first frame through a first transmission component and a third transmission component, and the support frame is rotatably connected to the second frame through a second transmission component and a fourth transmission component;

the bending structure further includes a first sliding transmission component in a transmission connection with the first transmission component, a second sliding transmission component in a transmission connection with the second transmission component, a third sliding transmission component in a transmission connection with the third transmission component and a fourth sliding transmission component in a transmission connection with the fourth transmission component, where when the first frame and the second frame rotate oppositely along the first rotating direction, under a transmission action of the first transmission component and the fourth transmission component, the first sliding transmission component is configured to drive the first sliding connection frame to move away from the first frame, and the fourth sliding transmission component drives the second sliding connection frame to move away from the second frame;

when the first frame and the second frame rotate oppositely along the second rotating direction, under a transmission action of the second transmission component and the third transmission component, the second sliding transmission component is configured to drive the first sliding connection frame to move close to the first frame, and the third transmission component drives the second sliding connection frame to move close to the second frame.

Optionally, the first transmission component and the second transmission component are at a first end of the support frame in an extending direction of the support frame, and the third transmission component and the fourth transmission component are at a second end of the support frame in the extending direction of the support frame.

Optionally, the first end and the second end are each provided with a first connecting portion, the first frame is provided with second connecting portions in a one-to-one correspondence to the first connecting portions, the second frame is provided with third connecting portions in a one-to-one correspondence to the first connecting portions, and the first transmission component includes:

a first rotating shaft arranged in parallel with the support frame, where an end of the first rotating shaft is provided with a first bevel gear, and the other end of the first rotating shaft penetrates through the first connecting portion and is fixed on the corresponding second connecting portion; and a second rotating shaft in a transmission connection with the first frame, where an end of the second rotating shaft is provided with a second bevel gear, the second bevel gear is meshed with the first bevel gear, and an extending direction of the second rotating shaft is intersected with an extending direction of the first rotating shaft;

the fourth transmission component includes:

a third rotating shaft arranged in parallel with the support frame, where an end of the third rotating shaft is provided with a third bevel gear, and the other end of the second rotating shaft penetrates through the first connecting portion and is fixed on the corresponding third connecting portion; and a fourth rotating shaft in a transmission connection with the second frame, where a fourth bevel gear is arranged at an end of the fourth rotating shaft, the fourth bevel gear is meshed with the third bevel gear, and an extending direction of the fourth rotating shaft is intersected with an extending direction of the third rotating shaft.

Optionally, the first sliding transmission component includes:

a first transmission connecting rod in a transmission connection with the second rotating shaft, where a first external thread structure is arranged at an end, away from the support frame, of the first transmission connecting rod;

a first transmission pipe fixedly connected to the first sliding connection frame, where an extending direction of the first transmission pipe is the same with an extending direction of the first transmission connecting rod, the first transmission connecting rod penetrates through the first transmission pipe, a first internal thread structure matched with the first external thread structure is arranged in the first transmission pipe, and when the first frame and the second frame are located on the same plane, an end of the first external thread structure close to support frame is connected to an end of the first transmission pipe away from the support frame.

Optionally, the first transmission connecting rod and the second shaft are integrated, and the first frame is provided with a position-limiting fixing pipe for the second shaft to pass through.

Optionally, the fourth sliding transmission component includes:

a fourth transmission connecting rod in a transmission connection with the fourth rotating shaft, where a fourth external thread structure is arranged at an end, away from the support frame, of the fourth transmission connecting rod;

a fourth transmission pipe fixedly connected to the second sliding connection frame, where an extending direction of the fourth transmission pipe is the same as an extending direction of the fourth transmission connecting rod, the fourth transmission connecting rod penetrates through the fourth transmission pipe, a fourth internal thread structure matched with the fourth external thread structure is arranged in the fourth transmission pipe, and when the first frame and the second frame are located on the same plane, an end, close to the support frame, of the fourth external thread structure is connected to an end, away from the support frame, of the fourth transmission pipe.

Optionally, the fourth transmission connecting rod and the fourth shaft are integrated, and the second frame is provided with a position-limiting fixing pipe for the fourth shaft to pass through.

Optionally, the first end and the second end are each provided with a first connecting portion, the first frame is provided with second connecting portions in a one-to-one correspondence to the first connecting portions, the second frame is provided with third connecting portions in a one-to-one correspondence to the first connecting portions, and the second transmission component includes:

a fifth rotating shaft arranged in parallel with the support frame, where a fifth bevel gear is arranged at an end of the fifth rotating shaft, and the other end of the fifth rotating shaft penetrates through the first connecting portion and is fixed on the corresponding third connecting portion;

a sixth rotating shaft in a transmission connection with the second frame, where a sixth bevel gear is arranged at an end of the sixth rotating shaft, the sixth bevel gear is meshed with the fifth bevel gear, and an extending direction of the sixth rotating shaft is intersected with an extending direction of the fifth rotating shaft;

the third transmission component includes:

a seventh rotating shaft arranged in parallel with the support frame, where an end of the seventh rotating shaft is provided with a seventh bevel gear, and the other end of the seventh rotating shaft penetrates through the first connecting portion and is fixed on the corresponding second connecting portion; and an eighth rotating shaft is in a transmission connection with the first frame, where an eighth bevel gear is arranged at an end of the eighth rotating shaft, the eighth bevel gear is meshed with the seventh bevel gear, and an extending direction of the eighth rotating shaft is intersected with an extending direction of the seventh rotating shaft.

Optionally, the second sliding transmission component includes:

a second transmission connecting rod in a transmission connection with the sixth rotating shaft, where a second external thread structure is arranged at an end, away from the support frame, of the second transmission connecting rod;

a second transmission pipe fixedly connected to the second sliding connection frame, where an extending direction of the second transmission pipe is the same as an extending direction of the second transmission connecting rod, a second internal thread structure matched with the second external thread structure is arranged in the second transmission pipe, and when the first frame and the second frame are located on the same plane, an end, away from the support frame, of the second external thread structure is connected to an end, close to the support frame, of the second transmission pipe.

Optionally, the second transmission connecting rod and the sixth rotating shaft are integrated, and the second frame is provided with a position-limiting fixing pipe for the sixth rotating shaft to pass through.

Optionally, the third sliding transmission component includes:

a third transmission connecting rod in a transmission connection with the eighth rotating shaft, where a third external thread structure is arranged at an end, away from the support frame, of the third transmission connecting rod;

a third transmission pipe fixedly connected to the first sliding connection frame, where an extending direction of the third transmission pipe is the same as an extending direction of the third transmission connecting rod, a third internal thread structure matched with the third external thread structure is arranged in the third transmission pipe, and when the first frame and the second frame are located on the same plane, an end, away from the support frame, of the third external thread structure is connected to an end, close to the support frame, of the third transmission pipe.

Optionally, the third transmission connecting rod and the eighth rotating shaft are integrated, and the first frame is provided with a position-limiting fixing pipe for the eighth rotating shaft to pass through.

Optionally, two ends of the support frame along the extending direction of the support frame are respectively provided with a first boss to form the first connecting portion, and the first connecting portion is provided with a through hole;

the first frame includes a first frame main body and a first subframe arranged between the first frame main body and the support frame, where the first subframe is provided with a second boss on two opposite sides respectively in an extending direction of the support frame to form the second connecting portion.

Optionally, two ends of the support frame along the extending direction of the support frame are respectively provided with a first boss to form the first connecting portion, and the first connecting portion is provided with a through hole;

the second frame includes second frame main part and a second subframe arranged between the second frame main body and the support frame, where the second subframe is provided with a third boss on two opposite sides respectively in an extending direction of the support frame to form the third connecting portion.

Optionally, the first sliding connection frame includes a first bottom plate and a first side plate, the first bottom plate includes a first edge close to the first frame, two second edges adjacent to the first edge and a third edge opposite to the first edge, the first side plate is connected to the second edge and the third edge, and portions, connected to the two second edges, of the first side plate respectively extend away from the first sliding connection frame to form a first sliding insertion portion;

the first frame is provided with first slots, for inserting the corresponding first sliding insertion portions, on two opposite sides in the first rotating direction, a length of the first slot in an extending direction of the first slot is larger than a length of the first sliding insertion portion in an extending direction of the first sliding insertion portion, and the first rotating direction is perpendicular to the extending direction of the first sliding insertion portion.

Optionally, the second sliding connection frame includes a second bottom plate and a second side plate, the second bottom plate includes a fourth edge close to the second frame, two fifth edges adjacent to the fourth edge and a sixth edge opposite to the fourth edge, the second side plate is connected to the fifth edges and the sixth edge, and portions, connected to the two fifth edges, of the second side plate extend away from the second sliding connection frame to form second sliding insertion portion;

the second frame is provided with second slots for inserting the corresponding second sliding insertion portions along two opposite sides of the second rotating direction, a length of the second slot in the extending direction is larger than a length of the second sliding insertion portion in the extending direction, and the second rotating direction is perpendicular to an extending direction of the second sliding insertion portion.

Optionally, the first end and the second end are each provided with a first connecting portion, the first frame is provided with second connecting portions in a one-to-one correspondence to the first connecting portions, the second frame is provided with third connecting portions in a one-to-one correspondence to the first connecting portions, and the first transmission component includes:

a first rotating shaft arranged in parallel with the support frame, where an end of the first rotating shaft is provided with a first bevel gear, and the other end of the first rotating shaft penetrates through the first connecting portion and is fixed on the corresponding second connecting portion;

the second rotating shaft is in a transmission connection with the first frame, an end of the second rotating shaft is provided with a second bevel gear, the second bevel gear is meshed with the first bevel gear, and the extending direction of the second rotating shaft is intersected with the extending direction of the first rotating shaft;

the fourth transmission component includes:

a third rotating shaft arranged in parallel with the support frame, where an end of the third rotating shaft is provided with a third bevel gear, and the other end of the second rotating shaft penetrates through the first connecting portion and is fixed on the corresponding third connecting portion;

a fourth rotating shaft in a transmission connection with the second frame, where a fourth bevel gear is arranged at an end of the fourth rotating shaft, the fourth bevel gear is meshed with the third bevel gear, and an extending direction of the fourth rotating shaft is intersected with an extending direction of the third rotating shaft;

the second transmission component includes:

a fifth rotating shaft arranged in parallel with the support frame, where a fifth bevel gear is arranged at an end of the fifth rotating shaft, and the other end of the fifth rotating shaft penetrates through the first connecting portion and is fixed on the corresponding third connecting portion;

a sixth rotating shaft in a transmission connection with the second frame, where a sixth bevel gear is arranged at an end of the sixth rotating shaft, the sixth bevel gear is meshed with the fifth bevel gear, and an extending direction of the sixth rotating shaft is intersected with an extending direction of the fifth rotating shaft;

the third transmission component includes:

a seventh rotating shaft arranged in parallel with the support frame, where an end of the seventh rotating shaft is provided with a seventh bevel gear, and the other end of the seventh rotating shaft penetrates through the first connecting portion and is fixed on the corresponding second connecting portion;

an eighth rotating shaft in a transmission connection with the first frame, where an eighth bevel gear is arranged at an end of the eighth rotating shaft, the eighth bevel gear is meshed with the seventh bevel gear, and an extending direction of the eighth rotating shaft is intersected with an extending direction of the seventh rotating shaft;

where a transmission ratio of the first bevel gear and the second bevel gear is a first transmission ratio, a transmission ratio of the third bevel gear and the fourth bevel gear is the first transmission ratio, a transmission ratio of the fifth bevel gear and the sixth bevel gear is a second transmission ratio, a transmission ratio of the seventh bevel gear and the eighth bevel gear is the second transmission ratio, and the first transmission ratio is larger than the second transmission ratio;

where diameters of the first bevel gear, the second bevel gear, the third bevel gear, the fourth bevel gear, the fifth bevel gear, the sixth bevel gear, the seventh bevel gear and the eighth bevel gear are all 1 to 6 mm;

the diameters of the second bevel gear and the fourth bevel gear are the same, the diameters of the sixth bevel gear and the eighth bevel gear are the same, the diameter of the second bevel gear is smaller than the diameter of the sixth bevel gear, the diameter of the second bevel gear is 2 to 6 mm, and the diameter of the sixth bevel gear is 1 to 3 mm;

where the diameter of the first bevel gear is larger than the diameter of the second bevel gear, the diameter of the third bevel gear is larger than the diameter of the fourth bevel gear, and the diameter of the fifth bevel gear, the diameter of the sixth bevel gear, the diameter of the seventh bevel gear and the diameter of the eighth bevel gear are the same;

where the diameter of the first bevel gear is 2.1 mm, the diameter of the second bevel gear is 1.5 mm, the diameter of the third bevel gear is the same as the diameter of the first bevel gear, and the diameter of the fourth bevel gear is the same as the diameter of the second bevel gear;

the diameter of the fifth bevel gear is 3 mm.

A display device is further provided in the present disclosure, including a flexible display module and a flexible display module middle frame, where the flexible display module includes a first non-bending area, a second non-bending area and a bending area between the first non-bending area and the second non-bending area, and the flexible display module includes a light-emitting surface and a back surface opposite to the light-emitting surface;

the flexible display module middle frame includes:

a first frame, configured to connect with the first non-bending area of the flexible display module;

a second frame, configured to connect with the second non-bending area of the flexible display module;

a bending structure connected to the first frame and the second frame and configured to control the first frame and the second frame to rotate relative to each other, to enable the flexible display module middle frame to be in a first state, a second state and a third state; where in the first state, the first frame and the second frame rotate oppositely along a first rotating direction to enable the flexible display module to be in an inward-folded state, and a light-emitting surface of the flexible display module corresponding to the first non-bending area faces a light-emitting surface of the flexible display module corresponding to the second non-bending area; in the second state, the first frame and the second frame rotate oppositely along a second rotation direction, to enable flexible display module to be in an outward-folded state, and a back surface of the first non-bending area faces a back surface of the second non-bending area; in the third state, the first frame and the second frame are in a same plane, to enable the flexible display module to be in an unfolded state, and the light-emitting surface of the flexible display module corresponding to the first non-bending area and the light-emitting surface of the flexible display module corresponding to the second non-bending area are in a same plane; and a first sliding connection frame connected to a side of the first frame away from the second frame, a second sliding connection frame connected to a side of the second frame away from the first frame;

in the first state, the first sliding connection frame is configured to move away from first frame, the second sliding connection frame is configured to move away from the second frame;

in the second state, the first sliding connection frame is configured to move close to the first frame, the second sliding connection frame is configured to move close to the second frame;

in the third state, the first sliding connection frame is spaced apart from the first frame at a first preset distance, the second sliding connection frame is spaced apart from the second frame at a second preset distance.

DETAILED DESCRIPTION

Figure 1:
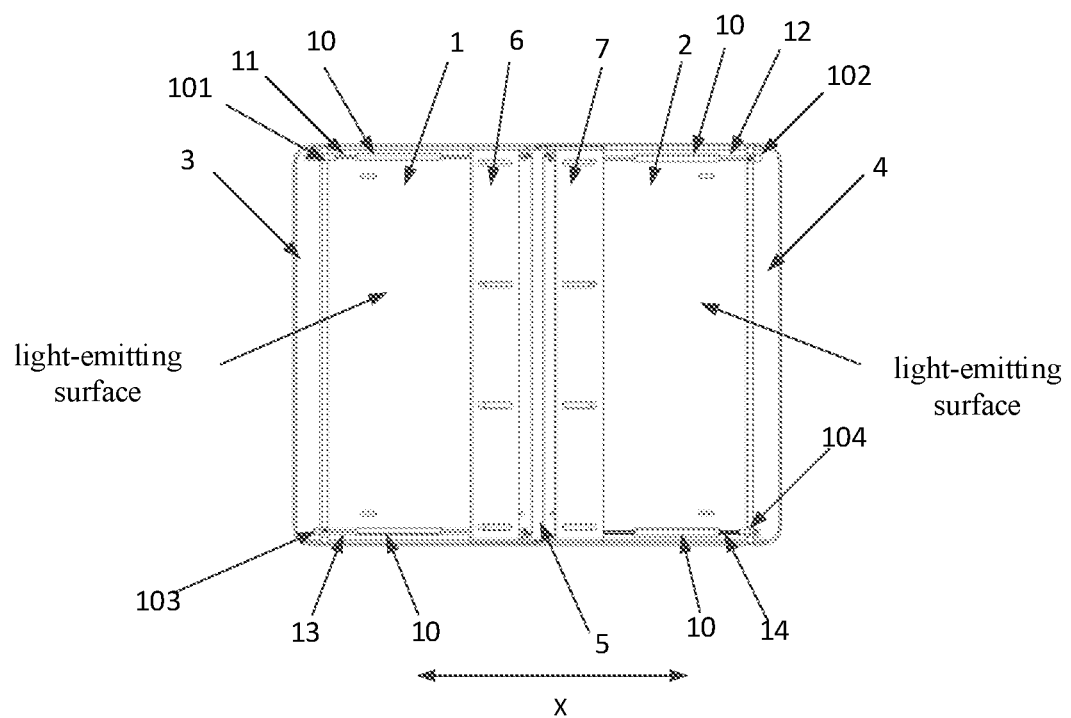
FIG. 1 is a rear view of a flexible display module middle frame in an embodiment of the present disclosure.

To make the objects, technical solutions and advantages of the embodiments of the present disclosure more apparent, the technical solutions of the embodiments of the present disclosure will be clearly and completely described below with reference to the drawings of the embodiments of the present disclosure. It should be apparent that the described embodiment is a one-plate embodiment of the present disclosure, and not all embodiments. All other embodiments, which can be derived from the description of the embodiments of the disclosure by a person skilled in the art, are intended to be within the scope of the disclosure.

In the description of the present disclosure, it should be noted that the terms "center", "upper", "lower", "left", "right", "vertical", "horizontal", "inner", "outer", and the like indicate orientations or positional relationships based on orientations or positional relationships shown in the drawings, only for convenience of description and simplification of description, but do not indicate or imply that the device or element referred to must have a particular orientation, be constructed in a particular orientation, and operate, and thus, should not be construed as limiting the present disclosure. Furthermore, the terms "first," "second," and "third" are used for descriptive purposes only and are not to be construed as indicating or implying relative importance.

When flexible display device buckled, flexible display module can produce certain amount of sliding, and the size of complete machine casing is fixed unchangeable, can produce certain skew between flexible display module and the center like this, especially, when flexible display device is in an inward-folded state, the flexible display module slides outwards and may expose in the middle frame. In the related art, through enclosing the frame in the periphery of middle frame in order to solve above-mentioned technical issue, but the frameless setting cannot be realized.

In view of the above technical issue, this embodiment provides a flexible display module middle frame, as shown in FIG. 1 to 11, the flexible display module includes a first non-bending region, a second non-bending region, and a bendable region located between the first non-bending region and the second non-bending region, and the flexible display module includes a light-emitting surface and a back surface opposite to the light-emitting surface; flexible display module middle frame includes:

a first frame 1 capable of being connected to the first non-bending region;

a second frame 2 capable of being connected to the second non-bending region; where a bending structure connected to the first frame 1 and the second frame 2;

the bending structure is configured to control the first frame 1 and the second frame 2 to rotate relatively, so that the flexible display module middle frame has a first state, a second state and a third state, in the first state, the first frame 1 and the second frame 2 rotate oppositely along a first rotating direction, so that the flexible display module is in an inward-folded state, and a light-emitting surface of the first non-bending area faces a light-emitting surface of the second non-bending area; in the second state, the first frame 1 and the second frame 2 rotate oppositely along a second rotation direction, so that the flexible display module is in an outward-folded state, and the back surface of the first non-bending area faces the back surface of the second non-bending area; in the third state, the first frame 1 and the second frame 2 are in the same plane, so that the flexible display module is in an unfolded state, and the light-emitting surface of the first unfolded area and the light-emitting surface of the second unfolded area are in the same plane; and a first sliding connection frame connected to one side, away from the second frame, of the first frame, a second sliding connection frame connected to one side, away from the first frame, of the second frame; in the first state, the first sliding connection frame moves towards the direction away from the first frame, the second sliding connection frame moves towards the direction away from the second frame, in the second state, the first sliding connection frame moves towards the direction near to the first frame, the second sliding connection frame moves towards the direction near to the second frame, in the third state, the first sliding connection frame has a first preset distance from the first frame, and the second sliding connection frame has a second preset distance from the second frame.

The bending structure is configured to control the first frame and the second frame to rotate relative to each other, so that the flexible display module middle frame has a first state, a second state and a third state, in the first state, the first frame and the second frame rotate oppositely along a first rotating direction, the flexible display module is in an inwards folded state, and a light-emitting surface of the first bending area faces a light-emitting surface of the second bending area; in the second state, the first frame and the second frame rotate oppositely along a second rotation direction, so that the flexible display module is in an outward-folded state, and the back of the first bending area faces the back of the second bending area; in the third state, the first frame and the second frame are in the same plane, so that the flexible display module is in an unfolded state, and the light-emitting surface of the first bending area and the light-emitting surface of the second bending area are in the same plane;

in an embodiment of the present disclosure, when the bending structure controls the first frame 1 and the second frame 2 to rotate in opposite directions along the first rotation direction, the first sliding connection frame 3 moves in a direction away from the first frame 1, the second sliding connection frame 4 moves in a direction away from the second frame 2, when the first frame 1 and the second frame 2 rotate in opposite directions along the second rotation direction, the first sliding connection frame 3 moves in a direction close to the first frame 1, the second sliding connection frame 4 moves in a direction close to the second frame 2, and the first sliding connection frame 3 and the second sliding connection frame 4 move in different directions according to different bending directions of the flexible display module, so that the flexible display module middle frame moves in a direction from the first frame 1 to the second frame 2 (refer to FIG. 1) X direction) of the flexible display module, the length of the flexible display module in the flexible display module (in this case, the first frame 1 and the second frame 2 rotate oppositely along the first rotation direction), and the length of the flexible display module in the flexible display module is changed correspondingly, so that the sliding amount of the flexible display module can be compensated when the flexible display module is folded outwards (in this case, the first frame 1 and the second frame 2 rotate oppositely along the second rotation direction), for example, when the flexible display module is folded inwards, the flexible display module will slide outwards to a certain extent, that is, the flexible display module is easily exposed to the middle frame, and in this case, the first frame 1 and the second frame 2 rotate oppositely along the first rotation direction, and the first sliding connection frame 3 moves away from the first frame 1, the second sliding connection frame 4 moves towards the direction away from the second frame 2, the first sliding connection frame 3 and the second sliding connection frame 4 move to exactly compensate the sliding of the flexible display module, so that the problem that the flexible display module deviates from the middle frame is avoided, and the frameless structure is realized.

Figure 2:
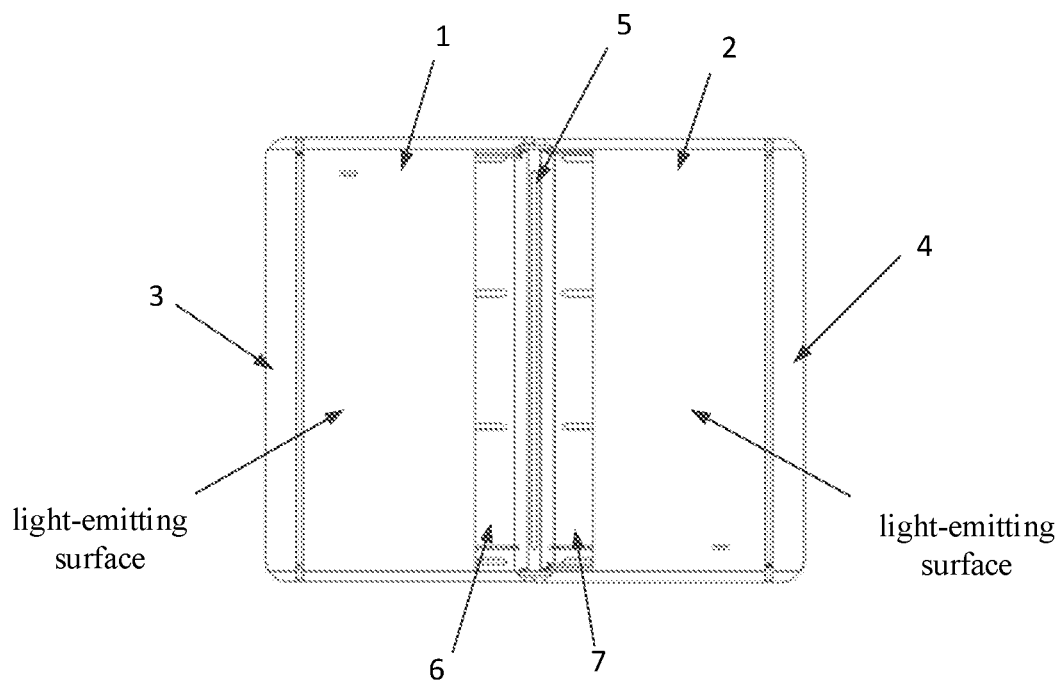
FIG. 2 is a front view of a flexible display module middle frame in an embodiment of the present disclosure.
Figure 3:
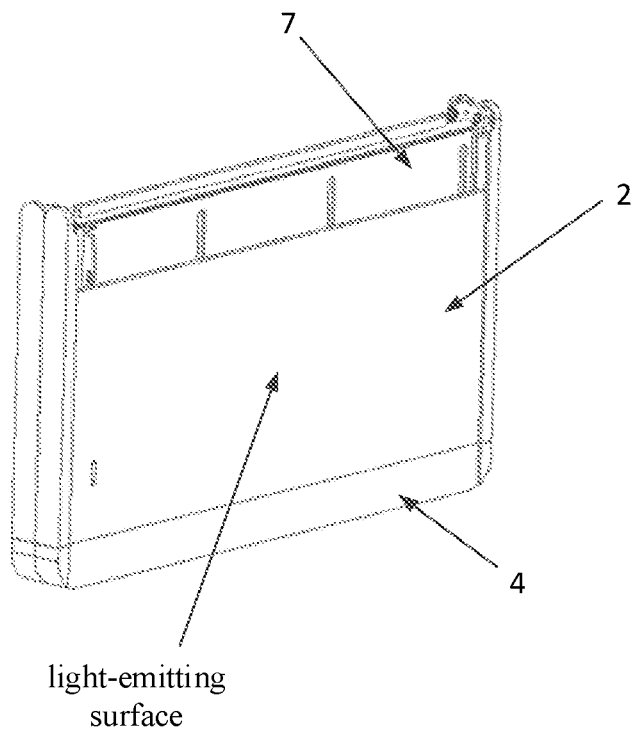
FIG. 3 is a schematic view illustrating a state of the flexible display module middle frame folded along a second rotation direction in an embodiment of the present disclosure.
Figure 4:
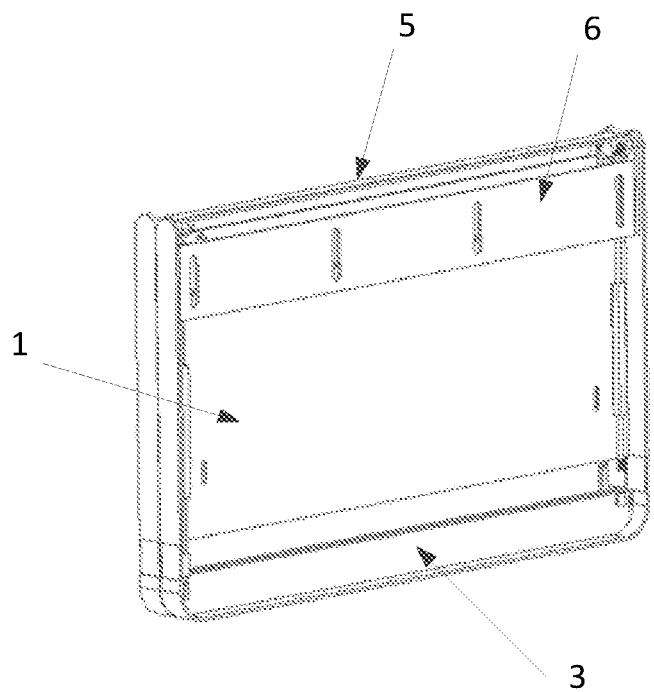
FIG. 4 is a schematic view illustrating a state of a f flexible display module middle frame folded inward along a first rotation direction in an embodiment of the present disclosure.

It should be noted that, in this embodiment, the light-emitting layer of the flexible display module is an inner side, the backlight side of the flexible display module is an outer side, that is, the flexible display module is folded inwards to form a first non-bending region and a second non-bending region of the flexible display module, the flexible display module is folded outwards to form a first non-bending region and a second non-bending region of the flexible display module, the first side of the corresponding flexible display module middle frame, which is used for accommodating the flexible display module, is an inner side (i.e., a forward side), the second side of the flexible display module middle frame, which is opposite to the first side, is an outer side, the first frame 1 and the second frame 2 rotate in opposite directions along the first rotation direction, that is, the flexible display module middle frame is folded inwards, the first frame 1 and the second frame 2 rotate in opposite directions along the second rotation direction, that is, the flexible display module middle frame is folded outwards, the back view of the flexible display module middle frame is shown in FIG. 1, the front view of the flexible display module middle frame is shown in FIG. 2, the state schematic diagram of the flexible display module middle frame after being folded outwards is shown in FIG. 3, and the state schematic diagram of the flexible display module middle frame after being folded inwards is shown in FIG. 4.

In order not to influence the bearing of the flexible display module, the bending structure is arranged at the outer side of the flexible display module middle frame.

In this embodiment, a preset distance is provided between the first sliding connection frame 3 and the first frame 1, a preset distance is provided between the second sliding connection frame 4 and the second frame 2, and since the flexible display module is bent symmetrically with respect to the bending axis, in this embodiment, the first frame 1 and the second frame 2 are symmetrically arranged with respect to the bending axis, the first sliding connection frame 3 and the second sliding connection frame 4 are symmetrically arranged with respect to the bending axis, a first preset distance provided between the first sliding connection frame 3 and the first frame 1 is the same as a second preset distance provided between the second sliding connection frame 4 and the second frame 2, and the first preset distance and the second preset distance are set such that a space is reserved for the movement of the first sliding connection frame 3 and the second sliding connection frame 4, the size of the preset distance can be set according to actual needs.

For example, the bending structure includes a support frame 5 located between the first frame 1 and the second frame 2, the support frame 5 is rotatably connected to the first frame 1 through at least one transmission component, and the support frame 5 is rotatably connected to the second frame 2 through at least one transmission component;

the bending structure further includes at least one sliding transmission component in a transmission connection with a transmission component connected to the first frame 1 so as to drive the first sliding connection frame 3 to move towards a direction away from or close to the first frame 1;

the bending structure further includes at least one sliding transmission component in a transmission connection with the transmission component connected to the second frame 2, so as to drive the second sliding connection frame 4 to move away from or close to the second frame 2.

For example, the support frame 5 is rotatably connected to the first frame 1 through a first transmission component and a third transmission component, and the support frame 5 is rotatably connected to the second frame 2 through a second transmission component and a fourth transmission component;

the bending structure further includes a first sliding transmission component in a transmission connection with the first transmission component, a second sliding transmission component in a transmission connection with the second transmission component, a third sliding transmission component in a transmission connection with the third transmission component, and a fourth sliding transmission component in a transmission connection with the fourth transmission component, where, when the first frame 1 and the second frame 2 rotate in opposite directions along the first rotation direction (i.e. when the flexible display module middle frame is folded inwards), under the transmission action of the first transmission component and the fourth transmission component, the first sliding transmission component drives the first sliding connection frame 3 to move in a direction away from the first frame 1, and the fourth sliding transmission component drives the second sliding connection frame 4 to move in a direction away from the second frame 2;

when the first frame 1 and the second frame 2 rotate in opposite directions along the second rotation direction (i.e. the flexible display module middle frame is folded outwards), under the transmission action of the second transmission component and the third transmission component, the second sliding transmission component drives the first sliding connection frame 3 to move in a direction close to the first frame 1, and the third transmission component drives the second sliding connection frame 4 to move in a direction close to the second frame 2.

According to the embodiment of the disclosure, when the flexible display module is bent in different directions, the first sliding connection frame 3 and the second sliding connection frame 4 move in different directions, specifically, when the flexible display module is folded inwards, the first frame 1 and the second frame 2 rotate in opposite directions along the first rotation direction, and under the transmission action of the first sliding transmission component and the fourth sliding transmission component, the first sliding connection frame 3 moves in a direction away from the first frame 1, the distance between the first sliding connection frame 3 and the first frame 1 is increased, and the second sliding connection frame 4 moves in a direction away from the second frame 2, and the distance between the second sliding connection frame 4 and the second frame 2 is increased. When the flexible display module is folded outwards, the first frame 1 and the second frame 2 rotate in the second rotation direction in opposite directions, and under the transmission action of the second sliding transmission component and the third sliding transmission component, the first sliding connection frame 3 moves towards the direction close to the first frame 1, the distance between the first sliding connection frame 3 and the first frame 1 is reduced, the second sliding connection frame 4 moves towards the direction close to the second frame 2, and the distance between the second sliding connection frame 4 and the second frame 2 is reduced.

It should be noted that, when the flexible display module middle frame is bent in different directions, the moving directions of the first sliding connection frame 3 and the second sliding connection frame 4 are different, in this embodiment, in order to avoid mutual influence between different moving states, when the first sliding transmission component and the fourth sliding transmission component are in the working state, the second sliding transmission component and the third sliding transmission component are in the non-working state, and similarly, when the first sliding transmission component and the fourth sliding transmission component are in the non-working state, the second sliding transmission component and the third sliding transmission component are in the working state.

For example, the first transmission component and the second transmission component are at a first end of the support frame 5 in the extending direction thereof, and the fourth transmission component and the third transmission component are at a second end of the support frame 5 in the extending direction thereof.

For example, each of the first end and the second end is provided with a first connection portion 51, the first frame 1 is provided with a second connection portion 61 in a one-to-one correspondence to the first connection portion 51, the second frame 2 is provided with a third connection portion 71 in a one-to-one correspondence to the first connection portion 51, and the first transmission component includes:

a first rotating shaft arranged in parallel with the support frame 5, where an end of the first rotating shaft is provided with a first bevel gear 100, and the other end of the first rotating shaft penetrates through the first connecting portion 51 and is fixed on the corresponding second connecting portion 61;

a second rotating shaft in a transmission connection with the first frame 1, where an end of the second rotating shaft is provided with a second bevel gear 200, the second bevel gear 200 is meshed with the first bevel gear 100, and the extending direction of the second rotating shaft is intersected with the extending direction of the first rotating shaft;

the fourth transmission component includes:

a third rotating shaft arranged in parallel with the support frame 5, where an end of the third rotating shaft is provided with a third bevel gear 300, and the other end of the second rotating shaft penetrates through the first connecting portion 51 and is fixed on the corresponding third connecting portion 71; and a fourth rotating shaft in a transmission connection with the second frame 2, where a fourth bevel gear 400 is arranged at an end of the fourth rotating shaft, the fourth bevel gear 400 is meshed with the third bevel gear 300, and the extending direction of the fourth rotating shaft is intersected with the extending direction of the third rotating shaft.

The bevel gears are used for transmitting motion and power between two intersecting axes, and this embodiment utilizes the characteristic of direction-changing transmission of the bevel gears to realize bending of a frame in the flexible display module, and realizes synchronous motion of the first frame 1 and the second frame 2 through synchronous transmission of the first transmission component and the fourth transmission component, but is not limited thereto, and in some embodiments, the motion of the first frame 1 and the second frame 2 may also be asynchronous.

In some embodiments of this embodiment, the first rotating shaft and the second rotating shaft are disposed vertically, and the third rotating shaft are disposed vertically, but not limited thereto.

Figure 5:
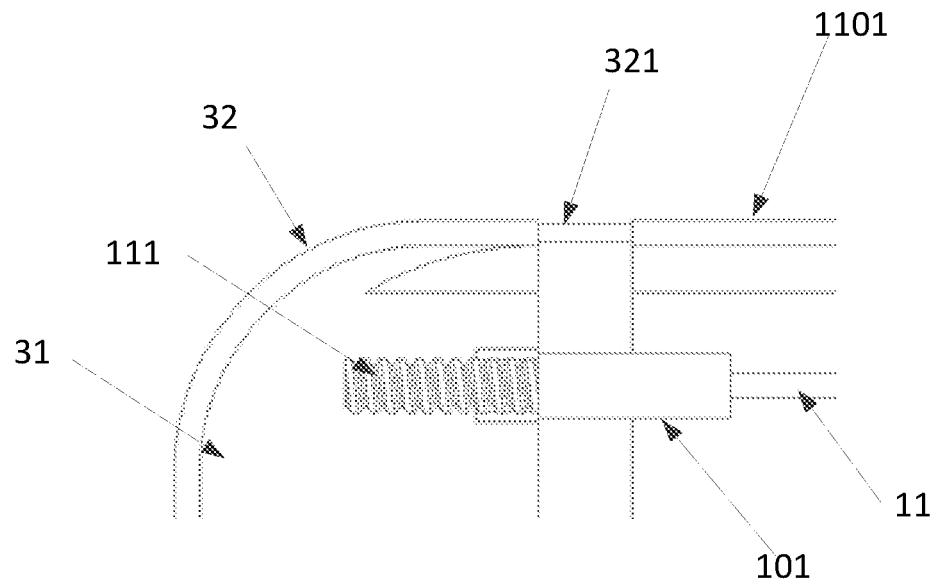
FIG. 5 is a schematic view of a first sliding transmission component in an embodiment of the present disclosure.

For example, with reference to FIG. 5, the first sliding transmission component includes:

a first transmission connecting rod 11 in a transmission connection with the second rotating shaft, where a first external thread structure 111 is arranged at an end of the first transmission connecting rod 11 away from the support frame 5;

a first transmission pipe 101 fixedly connected to the first sliding connection frame 3, where an extending direction of the first transmission pipe 101 is the same with an extending direction of the first transmission connecting rod 11, the first transmission connecting rod 11 penetrates through the first transmission pipe 101, a first internal thread structure matched with the first external thread structure 111 is arranged in the first transmission pipe 101, and when the first frame and the second frame are located on the same plane, an end of the first external thread structure close to support frame is connected to an end of the first transmission pipe away from the support frame.

The first sliding transmission component is configured to drive the first sliding connection frame 3 to move in a direction away from the first frame 1, when the first frame 1 and the second frame 2 are located on the same plane, that is, when the flexible display module middle frame is in an unfolded state, an end of the first external thread structure 111 on the first transmission connecting rod 11, which is close to the support frame 5, is connected to an end of the first transmission pipe 101, which is away from the support frame 5, that is, the first external thread structure 111 and the first internal thread structure of the first transmission pipe 101 are in a critical state, and the first external thread structure 111 and the first internal thread structure are not engaged, so that when the first sliding connection frame 3 needs to move in a direction away from the first frame 1, the first external thread structure 111 is engaged with the first internal thread structure, under the action of the first transmission connecting rod 11, the first sliding connection frame 3 moves away from the first frame 1. When the first sliding connection frame 3 moves towards the direction approaching to the first frame 1 under the action of the third sliding transmission component, the first external thread structure 111 is away from the first transmission pipe 101, and the first transmission connecting rod 11 idles, so that there is no transmission action between the first sliding transmission component and the first frame 1.

Figure 10:
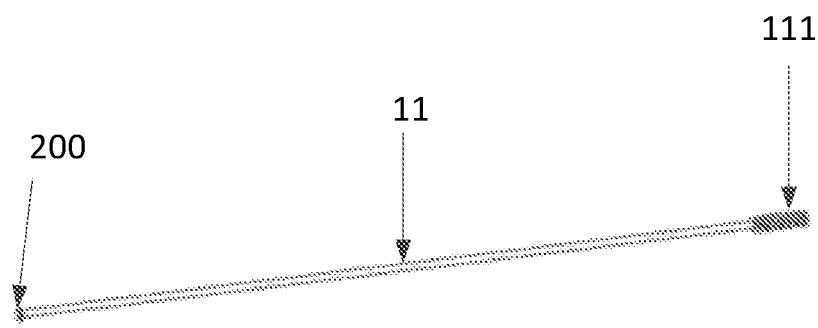
FIG. 10 is a schematic view of a first transmission connecting rod in an embodiment of the present disclosure.

For example, the first transmission connecting rod 11 and the second rotating shaft are of an integral structure, and the first frame 1 is provided with a limiting fixing pipe 10 for the second rotating shaft to pass through, referring to FIG. 10.

The first transmission connecting rod 11 and the second rotating shaft are of an integral structure, and the structure is simplified. The extending direction of the limiting fixing pipe 10 is the same as that of the first transmission connecting rod 11, the first transmission connecting rod 11 and the second rotating shaft are of an integrated structure, the first transmission connecting rod 11 is easy to deviate or shake due to overlong length, and the like, so that the transmission effect of the first sliding connection frame 3 is influenced, the problem is just solved due to the limiting fixing pipe 10, and the specific length of the limiting fixing pipe 10 can be set according to actual needs.

In this embodiment, the inner diameter of the limiting fixing pipe 10 is larger than the outer diameter of the second rotating shaft, so as to facilitate the rotation of the second rotating shaft.

For example, the fourth sliding transmission component includes:

a fourth transmission connecting rod 14 in a transmission connection with the fourth rotating shaft, where a fourth external thread structure is arranged at an end of the fourth transmission connecting rod 14, which is away from the support frame 5;

the fourth transmission pipe 104 is fixedly connected to the second sliding connection frame 4, an extending direction of the fourth transmission pipe 104 is the same as an extending direction of the fourth transmission connecting rod 14, the fourth transmission connecting rod 14 penetrates through the fourth transmission pipe 104, a fourth internal thread structure matched with the fourth external thread structure is arranged in the fourth transmission pipe 104, and when the first frame 1 and the second frame 2 are located on the same plane, an end, close to the support frame 5, of the fourth external thread structure is connected to an end, away from the support frame 5, of the fourth transmission pipe 104.

The fourth sliding transmission component and the first sliding transmission component are matched to realize inward folding (bending along the first rotation direction) of the flexible display module middle frame, the fourth sliding transmission component can drive the second sliding connection frame 4 to move in a direction away from the second frame 2, when the first frame 1 and the second frame 2 are located on the same plane, that is, when the flexible display module middle frame is in an unfolded state, an end of the fourth external thread structure on the fourth transmission connecting rod 14, which is close to the support frame 5, is connected to an end of the fourth transmission pipe 104, which is away from the support frame 5, that is, the fourth external thread structure and the internal thread structure of the fourth transmission pipe 104 are in a critical state, that is, the fourth external thread structure and the fourth internal thread structure are in an unmeshed state, thus, when the second sliding connection frame 4 needs to move in the direction away from the second frame 2, the fourth external thread structure is matched with the fourth internal thread structure, and under the action of the fourth transmission connecting rod 104, the second sliding connection frame 4 moves in the direction away from the second frame 2. When the second sliding connection frame 4 moves towards the direction close to the second frame 2 under the action of the second sliding transmission component, the fourth external thread structure is away from the fourth transmission pipe 104, and the fourth transmission connecting rod 14 idles, so that there is no transmission action between the fourth sliding transmission component and the second frame 2.

For example, the fourth transmission connecting rod 14 and the fourth rotating shaft are of an integral structure, and the second frame 2 is provided with a position-limiting fixing pipe 10 for the fourth rotating shaft to pass through.

The fourth transmission connecting rod 14 and the fourth rotating shaft are of an integral structure, and the structure arrangement is simplified. The extending direction of the limiting fixing pipe 10 is the same as that of the fourth transmission connecting rod 14, the fourth transmission connecting rod 14 and the fourth rotating shaft are of an integral structure, the fourth transmission connecting rod 14 is easy to shift or shake due to overlong length, and the like, so that the transmission effect of the second sliding connection frame 4 is influenced, the problem is just solved due to the limiting fixing pipe 10, and the specific length of the limiting fixing pipe 10 can be set according to actual needs.

In this embodiment, the inner diameter of the limiting fixing pipe 10 is larger than the outer diameter of the fourth rotating shaft, so as to facilitate the rotation of the fourth rotating shaft.

For example, the first end and the second end are both provided with first connecting portions 51, the first frame 1 is provided with second connecting portions 61 in a one-to-one correspondence to the first connecting portions 51, the second frame 2 is provided with third connecting portions 71 in a one-to-one correspondence to the first connecting portions 51, and the second transmission component includes:

a fifth rotating shaft arranged in parallel with the support frame 5, where a fifth bevel gear 500 is arranged at an end of the fifth rotating shaft, and the other end of the fifth rotating shaft penetrates through the first connecting portion 51 and is fixed on the corresponding third connecting portion 71;

a sixth rotating shaft in a transmission connection with the second frame 2, where a sixth bevel gear 600 is arranged at an end of the sixth rotating shaft, the sixth bevel gear 600 is engaged with the fifth bevel gear 500, and the extending direction of the sixth rotating shaft is intersected with the extending direction of the fifth rotating shaft;

the third transmission component includes:

a seventh rotating shaft arranged in parallel with the support frame 5, where an end of the seventh rotating shaft is provided with a seventh bevel gear 700, and the other end of the seventh rotating shaft penetrates through the first connecting portion 51 and is fixed on the corresponding second connecting portion 61; and an eighth rotating shaft in a transmission connection with the first frame 1, where an eighth bevel gear 800 is arranged at an end of the eighth rotating shaft, the eighth bevel gear 800 is meshed with the seventh bevel gear 700, and the extending direction of the eighth rotating shaft intersects with the extending direction of the seventh rotating shaft.

The second transmission component and the third transmission component are matched to realize outward-folded (bending along the second rotation direction) of the flexible display module middle frame.

For example, the second sliding transmission component includes:

a second transmission connecting rod 12 in a transmission connection with the sixth rotating shaft, where a second external thread structure is arranged at an end, away from the support frame 5, of the second transmission connecting rod 12;

a second transmission pipe 102 fixedly connected to the second sliding connection frame 4, an extending direction of the second transmission pipe 102 is the same as an extending direction of the second transmission connecting rod 12, a second internal thread structure matched with the second external thread structure is arranged in the second transmission pipe 102, and when the first frame 1 and the second frame 2 are located on the same plane, an end, away from the support frame 5, of the second external thread structure is connected to an end, close to the support frame 5, of the second transmission pipe 102.

The second sliding transmission component is configured to drive the first sliding connection frame 3 to move towards a direction close to the first frame 1, when the first frame 1 and the second frame 2 are located on the same plane, that is, when the flexible display module middle frame is in an unfolded state, an end of the second external thread structure on the second transmission connecting rod 12, which is away from the support frame 5, is connected to an end of the second transmission pipe 102, which is close to the support frame 5, that is, the second external thread structure and the second internal thread structure of the second transmission pipe 102 are in a critical state, and the second external thread structure and the second internal thread structure are in a non-meshed connection state, so that when the second sliding connection frame 4 needs to move towards a direction close to the second frame 2, the second external thread structure and the second internal thread structure are matched, under the action of the second transmission connecting rod 12, the second sliding connection frame 4 moves towards the second frame 2 pair. When the second sliding connection frame 4 moves towards the direction close to the second frame 2 under the action of the fourth sliding transmission component, the second external thread structure is away from the second transmission pipe 102, and the second transmission connecting rod 12 idles, so that there is no transmission action between the second sliding transmission component and the second frame 2.

For example, the second transmission connecting rod 12 and the sixth rotating shaft are integrated, and the second frame 2 is provided with a position-limiting fixing pipe 10 for the sixth rotating shaft to pass through.

The second transmission connecting rod 12 and the sixth rotating shaft are of an integral structure, and the structure arrangement is simplified. The extending direction of the limiting fixing pipe 10 is the same as that of the second transmission connecting rod 12, the second transmission connecting rod 12 and the sixth rotating shaft are of an integrated structure, the second transmission connecting rod 12 is easy to deviate or shake due to overlong length, and the like, so that the transmission effect of the second sliding connection frame 4 is influenced, the problem is just solved due to the limiting fixing pipe 10, and the specific length of the limiting fixing pipe 10 can be set according to actual needs.

It should be noted that the inner diameter of the limiting fixing pipe 10 is larger than the outer diameter of the sixth rotating shaft, which is beneficial to the rotation of the sixth rotating shaft.

Figure 6:
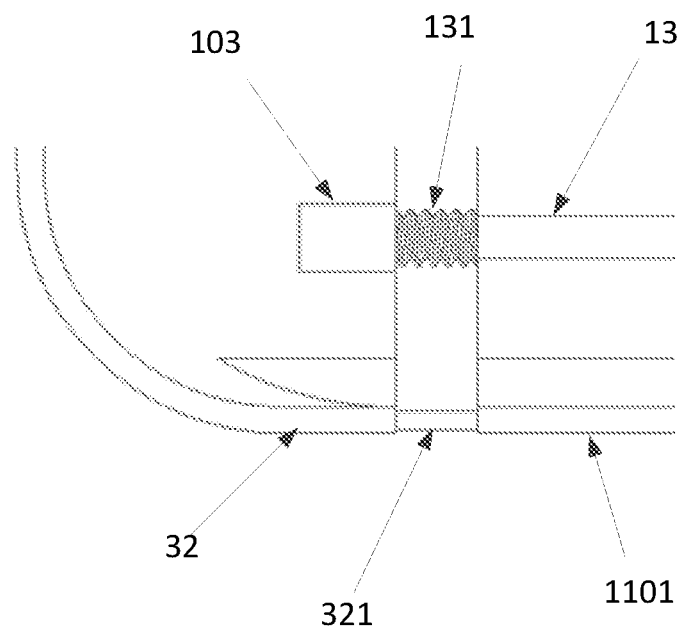
FIG. 6 is a schematic view of a third sliding transmission component in an embodiment of the present disclosure.

For example, referring to FIG. 6, the third sliding transmission component includes:

a third transmission connecting rod 13 in a transmission connection with the eighth rotating shaft, where a third external thread structure 131 is arranged at an end of the third transmission connecting rod 13 away from the support frame 5;

a third transmission pipe 103 fixedly connected to the first sliding connection frame 3, an extending direction of the third transmission pipe 103 is the same as an extending direction of the third transmission connecting rod 13, a third internal thread structure matched with the third external thread structure 131 is arranged in the third transmission pipe 103, and when the first frame 1 and the second frame 2 are located on the same plane, an end, away from the support frame 5, of the third external thread structure 131 is connected to an end, close to the support frame 5, of the third transmission pipe 103.

The third sliding transmission component and the second sliding transmission component cooperate to realize outward-folded (bending along the second rotation direction) of the flexible display module middle frame, the third sliding transmission component is arranged to drive the first sliding connection frame 3 to move close to the first frame 1, when the first frame 1 and the second frame 2 are located on the same plane, that is, when the flexible display module middle frame is in the unfolded state, an end of the third external thread structure 131 on the third transmission connecting rod 13 close to the support frame 5 is connected to an end of the third transmission pipe 103 away from the support frame 5, that is, the third external thread structure 131 and the third internal thread structure of the third transmission pipe 103 are in a critical state, that is, the third external thread structure and the third internal thread structure are in an unmeshed state, in this way, when the first sliding connection frame 3 needs to move towards the direction approaching to the first frame 1, the third external thread structure 131 is matched with the third internal thread structure, and under the action of the third transmission connecting rod 13, the first sliding connection frame 3 moves towards the direction approaching to the first frame 1. When the first sliding connection frame 3 moves in a direction away from the first frame 1 under the action of the first sliding transmission component, the third external thread structure 131 is away from the third transmission pipe 103, and the third transmission connecting rod 13 idles, so that there is no transmission action between the third sliding transmission component and the first frame 1.

Figure 9:
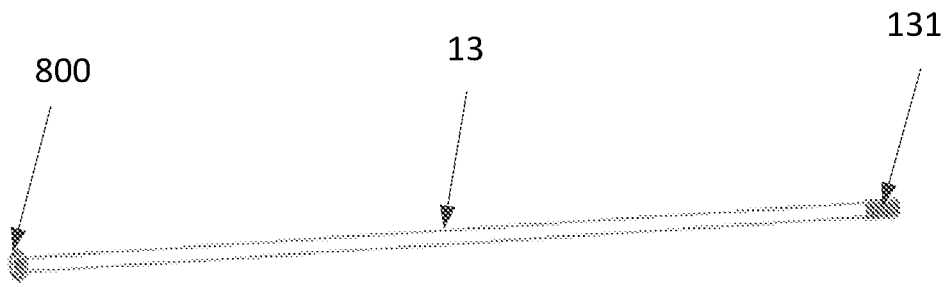
FIG. 9 is a schematic view of a third transmission connecting rod in an embodiment of the present disclosure.

For example, referring to FIG. 9, the third transmission connecting rod 13 and the eighth rotating shaft are an integral structure, and the first frame 1 is provided with a limiting fixing pipe 10 for the eighth rotating shaft to pass through.

The third transmission connecting rod 13 and the eighth rotating shaft are of an integral structure, and the structure is simplified. The extending direction of the limiting fixing pipe 10 is the same as that of the third transmission connecting rod 13, the third transmission connecting rod 13 and the eighth rotating shaft are of an integral structure, the third transmission connecting rod 13 is easy to deviate or shake due to overlong length, and the like, so that the transmission effect of the first sliding connection frame 3 is influenced, the problem is just solved due to the limiting fixing pipe 10, and the specific length of the limiting fixing pipe 10 can be set according to actual needs.

In this embodiment, the inner diameter of the limiting fixing pipe 10 is larger than the outer diameter of the eighth rotating shaft, so as to facilitate the rotation of the eighth rotating shaft.

Figure 7:
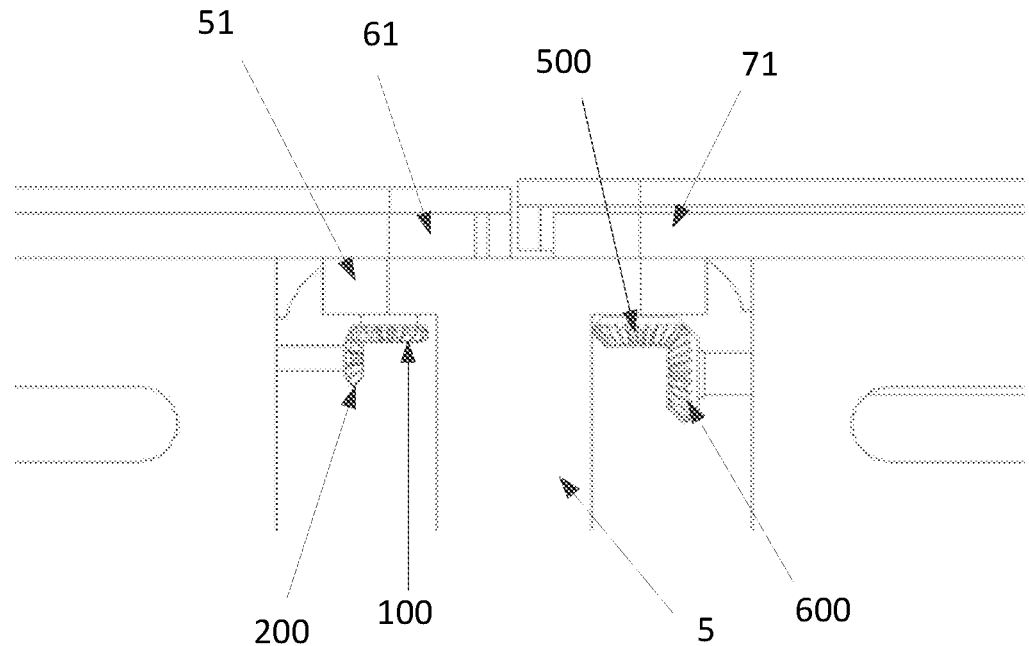
FIG. 7 is a schematic view of a first transmission component and a second transmission component in an embodiment of the present disclosure.
Figure 8:
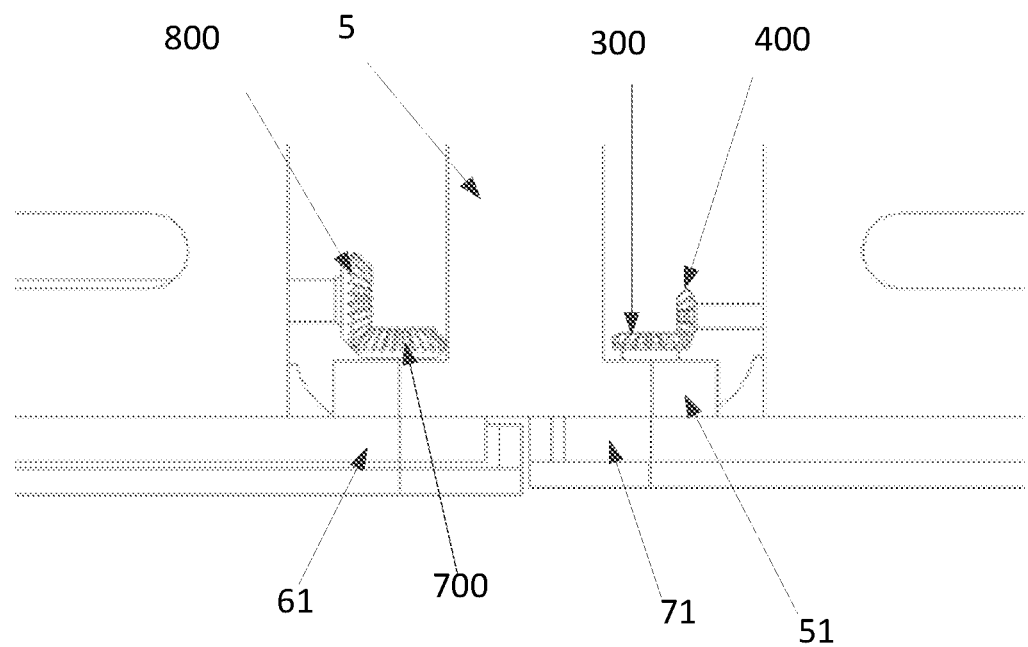
FIG. 8 is a schematic view of a third transmission component and a fourth transmission component in an embodiment of the present disclosure.

For example, referring to FIGS. 7 and 8, two ends of the support frame 5 along the extending direction thereof are respectively provided with a first boss to form the first connecting portion 51, and the first connecting portion 51 is provided with a through hole;

the first frame 1 includes a first frame main body and a first subframe 6 arranged between the first frame main body and the support frame 5, where two opposite sides of the first subframe 6 along the extending direction of the support frame 5 are respectively provided with a second boss in a protruding manner to form the second connecting portion 61.

For example, the first frame 1 includes a bottom plate and opposite side plates, the first subframe 6 includes a bottom plate connected to the bottom plate of the first frame 1, and two first sub-side plates correspondingly connected to the inner sides of the side plates of the first frame 1, and an end of the first sub-side plate close to the support frame 5 extends in a direction close to the support frame 5 to form the third connecting portion 61.

The first subframe 6 may be connected to the first frame body by screwing, welding, or the like, that is, the first subframe 6 and the first frame body may be detachably connected together, or may be fixedly connected, which is not limited herein as long as the first frame 1 can be driven to move.

For example, the first frame 1 includes oppositely disposed side plates 1101, the first subframe 6 includes two sub-side plates correspondingly connected to the inner sides of the corresponding side plates 1101 of the first frame 1, and an end of the sub-side plate close to the support frame 5 extends in a direction close to the support frame 5 to form the second connecting portion 61.

For example, two ends of the support frame 5 along the extending direction thereof are respectively provided with a first boss to form the first connecting portion 51, and the first connecting portion 51 is provided with a through hole;

the second frame 2 includes a second frame main body and a second subframe 7 arranged between the second frame main body and the support frame 5, where the second subframe 7 is provided with a third boss respectively protruding at two opposite sides along the extending direction of the support frame 5 to form the third connecting portion 71.

For example, the second frame 2 includes a bottom plate and opposite side plates, the second subframe 7 includes a bottom plate connected to the bottom plate of the second frame 2, and two second sub-side plates correspondingly connected to the inner sides of the corresponding side plates of the second frame 2, and an end of the second sub-side plate close to the support frame 5 extends in a direction close to the support frame 5 to form the third connecting portion 71.

The second subframe 7 can be connected to the second frame main body in a screwing way, a welding way and the like, namely, the second subframe 7 and the second frame main body can be detachably connected together and also can be fixedly connected, and the second subframe is not limited here as long as the second frame main body can be driven to move.

The first and second subframes 6, 7 enhances the strength of the first and second frames 1, 2.

Figure 11:
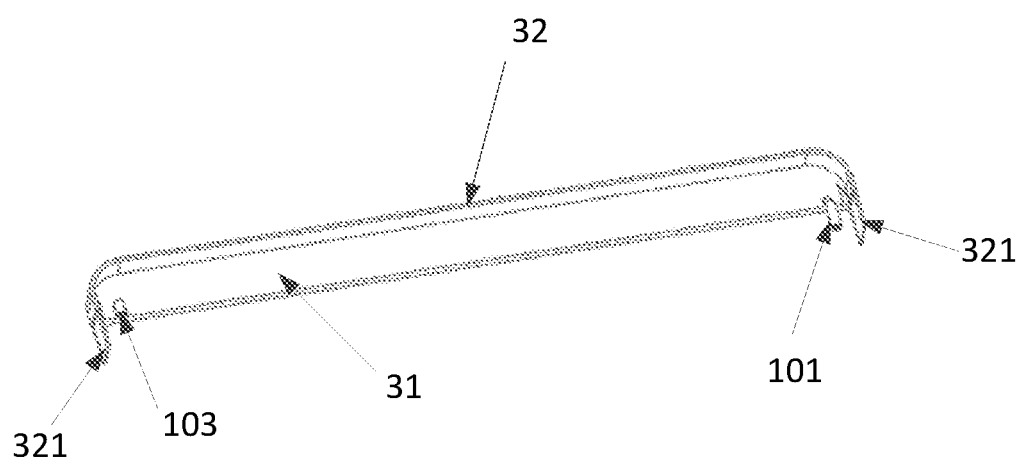
FIG. 11 is a schematic view of a first sliding connection frame in an embodiment of the disclosure.

For example, referring to FIGS. 5, 6 and 11, the first sliding connection frame 3 includes a first bottom plate 31 and a first side plate 32, the first bottom plate 31 includes a first edge close to the first frame 1, two second edges adjacent to the first edge, and a third edge opposite to the first edge, the first side plate 32 is connected to the second edge and the third edge, and the connection portions of the first side plate 32 and the two second edges extend to the direction away from the first sliding connection frame 3 to form first sliding insertion portions 321;

two opposite sides of the first frame 1 in a first direction (a direction parallel to the extending direction of the support frame 5) are provided with first slots into which the corresponding first sliding insertion portions 321 are inserted, the length of the first slots in the extending direction is greater than the length of the first sliding insertion portions 321 in the extending direction of the first sliding insertion portions 321, and the first direction is a direction perpendicular to the extending direction of the first sliding insertion portions 321.

Referring to FIGS. 5 and 6, the first frame 1 includes a bottom plate and side plates 1101 positioned at opposite sides of the bottom plate in the first direction, and the first insertion groove is provided on the side plates 1101 of the first frame 1. The length of the first slot in the extending direction thereof is greater than the length of the first sliding connection part 321 in the extending direction thereof, so that the first sliding connection frame 3 has a sufficient moving space.

In this embodiment, the length of the first sliding connection part 321 is greater than the maximum moving distance of the first sliding connection frame 3, so as to prevent the first sliding connection frame 3 from being separated from the first slot when the middle frame is bent.

For example, the second sliding connection frame 4 includes a second bottom plate and a second side plate, the second bottom plate includes a fourth edge close to the second frame 2, two fifth edges adjacent to the fourth edge, and a sixth edge opposite to the fourth edge, the second side plate is connected to the fifth edge and the sixth edge, and the portions of the second side plate connected to the two fifth edges extend in the direction away from the second sliding connection frame 4 to form second sliding plug-in portions;

the two opposite sides of the second frame 2 along the second direction are provided with second slots into which the corresponding second sliding insertion portions are inserted, the length of the second slot in the extending direction is greater than that of the second sliding insertion portion in the extending direction, and the second direction is a direction perpendicular to the extending direction of the second sliding insertion portion.

The second frame 2 includes a bottom plate and side plates located at opposite sides of the bottom plate in the second direction, and the second slot is disposed on the side plates of the second frame 2. The length of the second slot in the extending direction is greater than that of the second sliding connection part in the extending direction, so that the second sliding connection frame 4 has enough moving space.

In this embodiment, the length of the second sliding connection part is greater than the maximum moving distance of the second sliding connection frame 4, so that the second sliding connection frame 4 is prevented from being separated from the second slot when the middle frame is bent.

For example, each of the first end and the second end is provided with a first connection portion 51, the first frame 1 is provided with a second connection portion 61 in a one-to-one correspondence to the first connection portion 51, the second frame 2 is provided with a third connection portion 71 in a one-to-one correspondence to the first connection portion 51, and the first transmission component includes:

a first rotating shaft arranged in parallel with the support frame 5, where an end of the first rotating shaft is provided with a first bevel gear 100, and the other end of the first rotating shaft penetrates through the first connecting portion 51 and is fixed on the corresponding second connecting portion 61;

a second rotating shaft in a transmission connection with the first frame 1, where an end of the second rotating shaft is provided with a second bevel gear 200, the second bevel gear 200 is meshed with the first bevel gear 100, and the extending direction of the second rotating shaft is intersected with the extending direction of the first rotating shaft;

the fourth transmission component includes:

a third rotating shaft arranged in parallel with the support frame 5, where an end of the third rotating shaft is provided with a third bevel gear 300, and the other end of the second rotating shaft penetrates through the first connecting portion 51 and is fixed on the corresponding third connecting portion 71;

a fourth rotating shaft in a transmission connection with the second frame 2, where a fourth bevel gear 400 is arranged at an end of the fourth rotating shaft, the fourth bevel gear 400 is meshed with the third bevel gear 300, and the extending direction of the fourth rotating shaft is intersected with the extending direction of the third rotating shaft;

the second transmission component includes:

a fifth rotating shaft arranged in parallel with the support frame 5, where a fifth bevel gear 500 is arranged at an end of the fifth rotating shaft, and the other end of the fifth rotating shaft penetrates through the first connecting portion 51 and is fixed on the corresponding third connecting portion 71;

a sixth rotating shaft in a transmission connection with the second frame 2, where a sixth bevel gear 600 is arranged at an end of the sixth rotating shaft, the sixth bevel gear 600 is engaged with the fifth bevel gear 500, and the extending direction of the sixth rotating shaft is intersected with the extending direction of the fifth rotating shaft;

the third transmission component includes:

a seventh rotating shaft arranged in parallel with the support frame 5, where an end of the seventh rotating shaft is provided with a seventh bevel gear 700, and the other end of the seventh rotating shaft penetrates through the first connecting portion 51 and is fixed on the corresponding second connecting portion 61;

an eighth rotating shaft in a transmission connection with the first frame 1, where an eighth bevel gear 800 is arranged at an end of the eighth rotating shaft, the eighth bevel gear 800 is meshed with the seventh bevel gear 700, and the extending direction of the eighth rotating shaft is intersected with the extending direction of the seventh rotating shaft; where the first and the second end of the pipe are connected to each other, the transmission ratio of the first bevel gear 100 and the second bevel gear is a first transmission ratio, the transmission ratio of the third bevel gear and the fourth bevel gear is the first transmission ratio, the transmission ratio of the fifth bevel gear and the sixth bevel gear is a second transmission ratio, the transmission ratio of the seventh bevel gear and the eighth bevel gear is the second transmission ratio, and the first transmission ratio is greater than the second transmission ratio, referring to FIG. 7-10.

When the flexible display module is bent, the sliding amount during inward folding is greater than the sliding amount during outward-folded, and in this embodiment, the sliding amount of the hollow compensation of the flexible display module is a pitch of the transmission connecting rod x a rotation number of the transmission connecting rod, where the transmission connecting rod includes a first transmission connecting rod, a second transmission connecting rod, a third transmission connecting rod, and a fourth transmission connecting rod, and the pitch of the transmission connecting rod includes a pitch of the first external thread structure on the first transmission connecting rod, a pitch of the second external thread structure on the second transmission connecting rod, a pitch of the third external thread structure on the third transmission connecting rod, and a pitch of the fourth external thread structure on the fourth transmission connecting rod, so that in this embodiment, the first transmission ratio is greater than the second transmission ratio to realize that the first sliding connection frame and the second sliding connection frame rotate in different directions, move different distances.

In this embodiment, if the corresponding transmission connecting rods rotate for different numbers of turns, the corresponding first sliding connection frame or second sliding connection frame moves for different distances, so that the transmission ratios of the bevel gears are different, that is, if the first transmission ratio and the second transmission ratio are different, the number of input turns is constant, and the number of output turns is greater.

There are various ways of making the first gear ratio and the second gear ratio different, for example, the first gear ratio may be changed by changing the number of teeth of the first bevel gear and the second bevel gear, the third bevel gear and the fourth bevel gear, and the second gear ratio may be changed by changing the number of teeth of the fifth bevel gear and the sixth bevel gear, the seventh bevel gear and the eighth bevel gear.

The parameter (including diameter) setting of the first bevel gear, the second bevel gear, the third bevel gear, the fourth bevel gear, the fifth bevel gear, the sixth bevel gear, the seventh bevel gear and the eighth bevel gear can be set according to actual needs.

In this embodiment, the movement of the first sub frame and the second sub frame is realized through the transmission and the coordination of a thread structure and a bevel gear set, the slip amount of the hollow compensation of the flexible display module in this embodiment is the pitch of the transmission connecting rod, the number of the rotation turns of the transmission connecting rod is determined by the number of the rotation turns of the corresponding bevel gear, and the number of the rotation turns of the corresponding transmission connecting rod (including the first transmission connecting rod, the second transmission connecting rod, the third transmission connecting rod and the fourth transmission connecting rod) is determined by the number of the rotation turns of the corresponding bevel gear, that is, the diameter of the bevel gear corresponding to the corresponding transmission connecting rod is related to the slippage of the flexible display module and is limited by the thickness of the whole machine, and generally, for small-sized products (the flexible display module middle frame in this embodiment is not limited to small-sized products, but may also be applied to large-sized products), the thickness of the whole machine is 5-8 mm, in some embodiments of this embodiment, the thickness of the whole machine is 6.6 mm, but not limited thereto.

For example, the diameter of the first bevel gear, the second bevel gear, the third bevel gear, the fourth bevel gear, the fifth bevel gear, the sixth bevel gear, the seventh bevel gear and the eighth bevel gear is smaller than the thickness of the whole machine, for example, 1-6 mm.

For example, the diameters of the second bevel gear and the fourth bevel gear are the same, the diameters of the sixth bevel gear and the eighth bevel gear are the same, and since the slippage of the flexible display module during folding in is greater than the slippage of the flexible display module during folding out, the diameter of the second bevel gear is smaller than the diameter of the sixth bevel gear, for example, the diameter of the second bevel gear is 2-6 mm, and the diameter of the sixth bevel gear is 1-3 mm.

For example, the diameter of the first bevel gear is larger than that of the second bevel gear, the diameter of the third bevel gear is larger than that of the fourth bevel gear, and the diameter of the fifth bevel gear, that of the sixth bevel gear, that of the seventh bevel gear, and that of the eighth bevel gear are the same, as long as the slippage compensation amount of the flexible display module frame in the first state or the second state matches the slippage amount of the corresponding flexible display module when the flexible display module is folded in or folded out, the specific structural form of the bevel gears is not limited to the above.

For example, the diameter of the first bevel gear is 2.1 mm, the diameter of the second bevel gear is 1.5 mm, the diameter of the third bevel gear is the same as the diameter of the first bevel gear, and the diameter of the fourth bevel gear is the same as the diameter of the second bevel gear; the diameter of the five-cone gear is 3 mm.

According to the flexible display module middle frame in this disclosed embodiment, through the setting of structure and first sliding connection frame, second sliding connection frame of buckling for flexible module when buckling, the center can produce corresponding length variation, thereby compensating the amount of sliding that flexible module produced when buckling, realizing the frameless setting.

A display device is further provided in the embodiment of the disclosure further provides, which includes the flexible display module middle frame and the flexible display module; where the first and the second end of the pipe are connected to each other, the flexible display module includes a first non-bending area, a second non-bending area and a bending area positioned between the first non-bending area and the second non-bending area, and the flexible display module includes a light-emitting surface and a back surface opposite to the light-emitting surface;

flexible display module middle frame includes:

the first frame can be correspondingly connected to the first non-bending area;

the second frame can be correspondingly connected to the second non-bending area;

the bending structure is connected to the first frame and the second frame and configured to control the first frame and the second frame to rotate relative to each other so as to enable the flexible display module middle frame to have a first state, a second state and a third state, in the first state, the first frame and the second frame rotate oppositely along a first rotating direction so as to enable the flexible display module to be in an inward folding state, and the light-emitting surface of the first non-bending area faces the light-emitting surface of the second non-bending area; in the second state, the first frame and the second frame rotate oppositely along a second rotation direction, so that the flexible display module is in an outward-folded state, and the back surface of the first non-bending area faces the back surface of the second non-bending area; in the third state, the first frame and the second frame are in the same plane, so that the flexible display module is in an unfolded state, and the light-emitting surface of the first non-bending area and the light-emitting surface of the second non-bending area are in the same plane;

the first sliding connection frame is connected to one side, away from the second frame, of the first frame, the second sliding connection frame is connected to one side, away from the first frame, of the second frame, in the first state, the first sliding connection frame moves towards the direction away from the first frame, the second sliding connection frame moves towards the direction away from the second frame, in the second state, the first sliding connection frame moves towards the direction near to the first frame, the second sliding connection frame moves towards the direction near to the second frame, in the third state, the first sliding connection frame has a first preset distance from the first frame, and the second sliding connection frame has a second preset distance from the second frame.

According to the display device in the present disclosure, through the setting of the bending structure, the first sliding connection frame, the second sliding connection frame, when the flexible display module is bent, the middle frame can produce corresponding length variation, thereby compensating the amount of sliding that flexible module produced when bending, realizing the frameless setting.

The display device may be: the display device includes any product or component with a display function, such as a liquid crystal television, a liquid crystal display, a digital photo frame, a mobile phone, a tablet personal computer and the like, where the display device further includes a flexible circuit board, a printed circuit board and a back plate.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the scope of the disclosure, and these changes and modifications are to be considered within the scope of the disclosure.

What is claimed is:

1. A flexible display module middle frame, comprising:
   a first frame, configured to connect with a first non-bending area of a flexible display module;
   a second frame, configured to connect with a second non-bending area of the flexible display module;
   a bending structure connected to the first frame and the second frame and configured to control the first frame and the second frame to rotate relative to each other, to enable the flexible display module middle frame to be in a first state, a second state and a third state; wherein in the first state, the first frame and the second frame rotate oppositely along a first rotating direction to enable the flexible display module to be in an inward-folded state, and a light-emitting surface of the flexible display module corresponding to the first non-bending area faces a light-emitting surface of the flexible display module corresponding to the second non-bending area; in the second state, the first frame and the second frame rotate oppositely along a second rotation direction, to enable flexible display module to be in an outward-folded state, and a back surface of the first non-bending area faces a back surface of the second non-bending area; in the third state, the first frame and the second frame are in a same plane, to enable the flexible display module to be in an unfolded state, and the light-emitting surface of the flexible display module corresponding to the first non-bending area and the light-emitting surface of the flexible display module corresponding to the second non-bending area are in a same plane; and
   a first sliding connection frame connected to a side of the first frame away from the second frame, a second sliding connection frame connected to a side of the second frame away from the first frame;
   in the first state, the first sliding connection frame is configured to move away from first frame, the second sliding connection frame is configured to move away from the second frame;
   in the second state, the first sliding connection frame is configured to move close to the first frame, the second sliding connection frame is configured to move close to the second frame;
   in the third state, the first sliding connection frame is spaced apart from the first frame at a first preset distance, the second sliding connection frame is spaced apart from the second frame at a second preset distance.

2. The flexible display module middle frame according to claim 1, wherein the bending structure comprises a support frame between the first frame and the second frame, the support frame is rotatably connected to the first frame through at least one transmission component, and the support frame is rotatably connected to the second frame through at least one transmission component;
   the bending structure further comprises at least one sliding transmission component in a transmission connection with the transmission component connected to the first frame to drive the first sliding connection frame to move away from or close to the first frame;
   the bending structure further comprises at least one sliding transmission component in a transmission connection with the transmission component connected to the second frame to drive the second sliding connection frame to move away from or close to the second frame.

3. The flexible display module middle frame according to claim 2, wherein the support frame is rotatably connected to the first frame through a first transmission component and a third transmission component, and the support frame is rotatably connected to the second frame through a second transmission component and a fourth transmission component;
   the bending structure further comprises a first sliding transmission component in a transmission connection with the first transmission component, a second sliding transmission component in a transmission connection with the second transmission component, a third sliding transmission component in a transmission connection with the third transmission component and a fourth sliding transmission component in a transmission connection with the fourth transmission component, wherein when the first frame and the second frame rotate oppositely along the first rotating direction, under a transmission action of the first transmission component and the fourth transmission component, the first sliding transmission component is configured to drive the first sliding connection frame to move away from the first frame, and the fourth sliding transmission component drives the second sliding connection frame to move away from the second frame;

when the first frame and the second frame rotate oppositely along the second rotating direction, under a transmission action of the second transmission component and the third transmission component, the second sliding transmission component is configured to drive the first sliding connection frame to move close to the first frame, and the third transmission component drives the second sliding connection frame to move close to the second frame.

4. The flexible display module middle frame according to claim 3, wherein the first transmission component and the second transmission component are at a first end of the support frame in an extending direction of the support frame, and the third transmission component and the fourth transmission component are at a second end of the support frame in the extending direction of the support frame.

5. The flexible display module middle frame according to claim 4, wherein the first end and the second end are each provided with a first connecting portion, the first frame is provided with second connecting portions in a one-to-one correspondence to the first connecting portions, the second frame is provided with third connecting portions in a one-to-one correspondence to the first connecting portions, and the first transmission component comprises:

a first rotating shaft arranged in parallel with the support frame, wherein an end of the first rotating shaft is provided with a first bevel gear, and the other end of the first rotating shaft penetrates through the first connecting portion and is fixed on the corresponding second connecting portion; and a second rotating shaft in a transmission connection with the first frame, wherein an end of the second rotating shaft is provided with a second bevel gear, the second bevel gear is meshed with the first bevel gear, and an extending direction of the second rotating shaft is intersected with an extending direction of the first rotating shaft;

the fourth transmission component comprises:

a third rotating shaft arranged in parallel with the support frame, wherein an end of the third rotating shaft is provided with a third bevel gear, and the other end of the second rotating shaft penetrates through the first connecting portion and is fixed on the corresponding third connecting portion; and a fourth rotating shaft in a transmission connection with the second frame, wherein a fourth bevel gear is arranged at an end of the fourth rotating shaft, the fourth bevel gear is meshed with the third bevel gear, and an extending direction of the fourth rotating shaft is intersected with an extending direction of the third rotating shaft.

6. The flexible display module middle frame according to claim 5, wherein the first sliding transmission component comprises:

a first transmission connecting rod in a transmission connection with the second rotating shaft, wherein a first external thread structure is arranged at an end, away from the support frame, of the first transmission connecting rod;

a first transmission pipe fixedly connected to the first sliding connection frame, wherein an extending direction of the first transmission pipe is the same with an extending direction of the first transmission connecting rod, the first transmission connecting rod penetrates through the first transmission pipe, a first internal thread structure matched with the first external thread structure is arranged in the first transmission pipe, and when the first frame and the second frame are located on the same plane, an end of the first external thread structure close to support frame is connected to an end of the first transmission pipe away from the support frame.

7. The flexible display module middle frame according to claim 6, wherein the first transmission connecting rod and the second shaft are integrated, and the first frame is provided with a position-limiting fixing pipe for the second shaft to pass through.

8. The flexible display module middle frame according to claim 5, wherein the fourth sliding transmission component comprises:

a fourth transmission connecting rod in a transmission connection with the fourth rotating shaft, wherein a fourth external thread structure is arranged at an end, away from the support frame, of the fourth transmission connecting rod;

a fourth transmission pipe fixedly connected to the second sliding connection frame, wherein an extending direction of the fourth transmission pipe is the same as an extending direction of the fourth transmission connecting rod, the fourth transmission connecting rod penetrates through the fourth transmission pipe, a fourth internal thread structure matched with the fourth external thread structure is arranged in the fourth transmission pipe, and when the first frame and the second frame are located on the same plane, an end, close to the support frame, of the fourth external thread structure is connected to an end, away from the support frame, of the fourth transmission pipe.

9. The flexible display module middle frame according to claim 8, wherein the fourth transmission connecting rod and the fourth shaft are integrated, and the second frame is provided with a position-limiting fixing pipe for the fourth shaft to pass through.

10. The flexible display module middle frame according to claim 4, wherein the first end and the second end are each provided with a first connecting portion, the first frame is provided with second connecting portions in a one-to-one correspondence to the first connecting portions, the second frame is provided with third connecting portions in a one-to-one correspondence to the first connecting portions, and the second transmission component comprises:

a fifth rotating shaft arranged in parallel with the support frame, wherein a fifth bevel gear is arranged at an end of the fifth rotating shaft, and the other end of the fifth rotating shaft penetrates through the first connecting portion and is fixed on the corresponding third connecting portion;

a sixth rotating shaft in a transmission connection with the second frame, wherein a sixth bevel gear is arranged at an end of the sixth rotating shaft, the sixth bevel gear is meshed with the fifth bevel gear, and an extending direction of the sixth rotating shaft is intersected with an extending direction of the fifth rotating shaft;

the third transmission component comprises:
a seventh rotating shaft arranged in parallel with the support frame, wherein an end of the seventh rotating shaft is provided with a seventh bevel gear, and the other end of the seventh rotating shaft penetrates through the first connecting portion and is fixed on the corresponding second connecting portion; and an eighth rotating shaft is in a transmission connection with the first frame, wherein an eighth bevel gear is arranged at an end of the eighth rotating shaft, the eighth bevel gear is meshed with the seventh bevel gear, and an extending direction of the eighth rotating shaft is intersected with an extending direction of the seventh rotating shaft.

11. The flexible display module middle frame according to claim 10, wherein the second sliding transmission component comprises:
a second transmission connecting rod in a transmission connection with the sixth rotating shaft, wherein a second external thread structure is arranged at an end, away from the support frame, of the second transmission connecting rod;
a second transmission pipe fixedly connected to the second sliding connection frame, wherein an extending direction of the second transmission pipe is the same as an extending direction of the second transmission connecting rod, a second internal thread structure matched with the second external thread structure is arranged in the second transmission pipe, and when the first frame and the second frame are located on the same plane, an end, away from the support frame, of the second external thread structure is connected to an end, close to the support frame, of the second transmission pipe.

12. The flexible display module middle frame according to claim 11, wherein the second transmission connecting rod and the sixth rotating shaft are integrated, and the second frame is provided with a position-limiting fixing pipe for the sixth rotating shaft to pass through.

13. The flexible display module middle frame according to claim 10, wherein the third sliding transmission component comprises:
a third transmission connecting rod in a transmission connection with the eighth rotating shaft, wherein a third external thread structure is arranged at an end, away from the support frame, of the third transmission connecting rod;
a third transmission pipe fixedly connected to the first sliding connection frame, wherein an extending direction of the third transmission pipe is the same as an extending direction of the third transmission connecting rod, a third internal thread structure matched with the third external thread structure is arranged in the third transmission pipe, and when the first frame and the second frame are located on the same plane, an end, away from the support frame, of the third external thread structure is connected to an end, close to the support frame, of the third transmission pipe.

14. The flexible display module middle frame according to claim 13, wherein the third transmission connecting rod and the eighth rotating shaft are integrated, and the first frame is provided with a position-limiting fixing pipe for the eighth rotating shaft to pass through.

15. The flexible display module middle frame according to claim 5, wherein two ends of the support frame along the extending direction of the support frame are respectively provided with a first boss to form the first connecting portion, and the first connecting portion is provided with a through hole;

the first frame comprises a first frame main body and a first subframe arranged between the first frame main body and the support frame, wherein the first subframe is provided with a second boss on two opposite sides respectively in an extending direction of the support frame to form the second connecting portion.

16. The flexible display module middle frame according to claim 5, wherein two ends of the support frame along the extending direction of the support frame are respectively provided with a first boss to form the first connecting portion, and the first connecting portion is provided with a through hole;

the second frame comprises second frame main part and a second subframe arranged between the second frame main body and the support frame, wherein the second subframe is provided with a third boss on two opposite sides respectively in an extending direction of the support frame to form the third connecting portion.

17. The flexible display module middle frame according to claim 3, wherein the first sliding connection frame comprises a first bottom plate and a first side plate, the first bottom plate comprises a first edge close to the first frame, two second edges adjacent to the first edge and a third edge opposite to the first edge, the first side plate is connected to the second edge and the third edge, and portions, connected to the two second edges, of the first side plate respectively extend away from the first sliding connection frame to form a first sliding insertion portion;

the first frame is provided with first slots, for inserting the corresponding first sliding insertion portions, on two opposite sides in the first rotating direction, a length of the first slot in an extending direction of the first slot is larger than a length of the first sliding insertion portion in an extending direction of the first sliding insertion portion, and the first rotating direction is perpendicular to the extending direction of the first sliding insertion portion.

18. The flexible display module middle frame according to claim 3, wherein the second sliding connection frame comprises a second bottom plate and a second side plate, the second bottom plate comprises a fourth edge close to the second frame, two fifth edges adjacent to the fourth edge and a sixth edge opposite to the fourth edge, the second side plate is connected to the fifth edges and the sixth edge, and portions, connected to the two fifth edges, of the second side plate extend away from the second sliding connection frame to form second sliding insertion portion;

the second frame is provided with second slots for inserting the corresponding second sliding insertion portions along two opposite sides of the second rotating direction, a length of the second slot in the extending direction is larger than a length of the second sliding insertion portion in the extending direction, and the second rotating direction is perpendicular to an extending direction of the second sliding insertion portion.

19. The flexible display module middle frame according to claim 4, wherein the first end and the second end are each provided with a first connecting portion, the first frame is provided with second connecting portions in a one-to-one correspondence to the first connecting portions, the second frame is provided with third connecting portions in a one-to-one correspondence to the first connecting portions, and the first transmission component comprises:

a first rotating shaft arranged in parallel with the support frame, wherein an end of the first rotating shaft is provided with a first bevel gear, and the other end of the first rotating shaft penetrates through the first connecting portion and is fixed on the corresponding second connecting portion;

the second rotating shaft is in a transmission connection with the first frame, an end of the second rotating shaft is provided with a second bevel gear, the second bevel gear is meshed with the first bevel gear, and the extending direction of the second rotating shaft is intersected with the extending direction of the first rotating shaft;

the fourth transmission component includes:

a third rotating shaft arranged in parallel with the support frame, wherein an end of the third rotating shaft is provided with a third bevel gear, and the other end of the second rotating shaft penetrates through the first connecting portion and is fixed on the corresponding third connecting portion;

a fourth rotating shaft in a transmission connection with the second frame, wherein a fourth bevel gear is arranged at an end of the fourth rotating shaft, the fourth bevel gear is meshed with the third bevel gear, and an extending direction of the fourth rotating shaft is intersected with an extending direction of the third rotating shaft;

the second transmission component comprises:

a fifth rotating shaft arranged in parallel with the support frame, wherein a fifth bevel gear is arranged at an end of the fifth rotating shaft, and the other end of the fifth rotating shaft penetrates through the first connecting portion and is fixed on the corresponding third connecting portion;

a sixth rotating shaft in a transmission connection with the second frame, wherein a sixth bevel gear is arranged at an end of the sixth rotating shaft, the sixth bevel gear is meshed with the fifth bevel gear, and an extending direction of the sixth rotating shaft is intersected with an extending direction of the fifth rotating shaft;

the third transmission component comprises:

a seventh rotating shaft arranged in parallel with the support frame, wherein an end of the seventh rotating shaft is provided with a seventh bevel gear, and the other end of the seventh rotating shaft penetrates through the first connecting portion and is fixed on the corresponding second connecting portion;

an eighth rotating shaft in a transmission connection with the first frame, wherein an eighth bevel gear is arranged at an end of the eighth rotating shaft, the eighth bevel gear is meshed with the seventh bevel gear, and an extending direction of the eighth rotating shaft is intersected with an extending direction of the seventh rotating shaft;

wherein a transmission ratio of the first bevel gear and the second bevel gear is a first transmission ratio, a transmission ratio of the third bevel gear and the fourth bevel gear is the first transmission ratio, a transmission ratio of the fifth bevel gear and the sixth bevel gear is a second transmission ratio, a transmission ratio of the seventh bevel gear and the eighth bevel gear is the second transmission ratio, and the first transmission ratio is larger than the second transmission ratio;

wherein diameters of the first bevel gear, the second bevel gear, the third bevel gear, the fourth bevel gear, the fifth bevel gear, the sixth bevel gear, the seventh bevel gear and the eighth bevel gear are all 1 to 6 mm;

the diameters of the second bevel gear and the fourth bevel gear are the same, the diameters of the sixth bevel gear and the eighth bevel gear are the same, the diameter of the second bevel gear is smaller than the diameter of the sixth bevel gear, the diameter of the second bevel gear is 2 to 6 mm, and the diameter of the sixth bevel gear is 1 to 3 mm;

wherein the diameter of the first bevel gear is larger than the diameter of the second bevel gear, the diameter of the third bevel gear is larger than the diameter of the fourth bevel gear, and the diameter of the fifth bevel gear, the diameter of the sixth bevel gear, the diameter of the seventh bevel gear and the diameter of the eighth bevel gear are the same;

wherein the diameter of the first bevel gear is 2.1 mm, the diameter of the second bevel gear is 1.5 mm, the diameter of the third bevel gear is the same as the diameter of the first bevel gear, and the diameter of the fourth bevel gear is the same as the diameter of the second bevel gear;

the diameter of the fifth bevel gear is 3 mm.

20. A display device, comprising a flexible display module and a flexible display module middle frame, wherein the flexible display module comprises a first non-bending area, a second non-bending area and a bending area between the first non-bending area and the second non-bending area, and the flexible display module comprises a light-emitting surface and a back surface opposite to the light-emitting surface;

the flexible display module middle frame comprises:

a first frame, configured to connect with the first non-bending area of the flexible display module;

a second frame, configured to connect with the second non-bending area of the flexible display module;

a bending structure connected to the first frame and the second frame and configured to control the first frame and the second frame to rotate relative to each other, to enable the flexible display module middle frame to be in a first state, a second state and a third state; wherein in the first state, the first frame and the second frame rotate oppositely along a first rotating direction to enable the flexible display module to be in an inward-folded state, and a light-emitting surface of the flexible display module corresponding to the first non-bending area faces a light-emitting surface of the flexible display module corresponding to the second non-bending area; in the second state, the first frame and the second frame rotate oppositely along a second rotation direction, to enable flexible display module to be in an outward-folded state, and a back surface of the first non-bending area faces a back surface of the second non-bending area; in the third state, the first frame and the second frame are in a same plane, to enable the flexible display module to be in an unfolded state, and the light-emitting surface of the flexible display module corresponding to the first non-bending area and the light-emitting surface of the flexible display module corresponding to the second non-bending area are in a same plane; and a first sliding connection frame connected to a side of the first frame away from the second frame, a second sliding connection frame connected to a side of the second frame away from the first frame;

in the first state, the first sliding connection frame is configured to move away from first frame, the second sliding connection frame is configured to move away from the second frame;

in the second state, the first sliding connection frame is configured to move close to the first frame, the second sliding connection frame is configured to move close to the second frame;

in the third state, the first sliding connection frame is spaced apart from the first frame at a first preset distance, the second sliding connection frame is spaced apart from the second frame at a second preset distance.

\* \* \* \* \*